United States Patent [19]

Nakamura et al.

[11] Patent Number: 4,469,975
[45] Date of Patent: Sep. 4, 1984

[54] PIEZOELECTRIC VIBRATOR DEVICE INCLUDING VIBRATOR ELEMENT AND FRAME OF UNITARY CONSTRUCTION

[75] Inventors: Takeshi Nakamura, Uji; Hiroshi Nishiyama, Muko, both of Japan

[73] Assignee: Murata Manufacturing Co., Ltd., Japan

[21] Appl. No.: 456,309

[22] Filed: Jan. 6, 1983

[30] Foreign Application Priority Data

Jan. 7, 1982 [JP] Japan ................................ 57/1513

[51] Int. Cl.³ .......................................... H01L 41/18
[52] U.S. Cl. .................................... 310/321; 310/353; 310/368
[58] Field of Search ................. 310/321–324, 310/352, 353, 366, 367, 345, 334, 368

[56] References Cited

U.S. PATENT DOCUMENTS

| 3,486,046 | 12/1969 | Zalar ....................................... 310/324 |
| 3,535,686 | 10/1970 | Barnett .................................... 310/366 |
| 4,190,785 | 2/1980 | Kompanek ............................ 310/339 |
| 4,193,010 | 3/1980 | Kompanek ............................ 310/330 |

FOREIGN PATENT DOCUMENTS 55-52621 4/1980 Japan ..................................... 310/367

Primary Examiner—J. D. Miller
Assistant Examiner—D. L. Rebsch
Attorney, Agent, or Firm—Ostrolenk, Faber, Gerb & Soffen

[57] ABSTRACT

A piezoelectric vibrating device comprises a vibrating element supported by a support frame through at least two arms with the support frame surrounding the vibrating element. The vibrating element, the support frame and the support arms are of one-piece construction fabricated from a sheet of temperature-stable metal of constant elasticity. A ZnO layer is formed so as to overlay the vibrating element and also a portion of the support frame, and electrodes are formed so as to overlay a part of the ZnO layer on the vibrating element and another part of the ZnO layer on the support frame, respectively. One of the electrodes on the other part of the ZnO layer cooperates with the metal of constant elasticity to define a static capacitance with the ZnO layer serving as a dielectric body. An aluminum layer is interposed between the ZnO layer and the vibrating element.

3 Claims, 5 Drawing Figures

PIEZOELECTRIC VIBRATOR DEVICE INCLUDING VIBRATOR ELEMENT AND FRAME OF UNITARY CONSTRUCTION

BACKGROUND OF THE INVENTION

The present invention relates to a piezoelectric vibrator device comprising a piezoelectric vibrating element, which is utilized to form an oscillator in combination with an integrated circuit or the like.

As an oscillator utilizing a piezoelectric vibrating element, both Colpitts oscillator and Hartley oscillator have long been well known.

Colpitts oscillator comprises, as shown in FIG. 1 of the accompanying drawings, a parallel circuit of a piezoelectric vibrating element 12 and a resistor 13, which is in turn connected in parallel to an inverting amplifier 11, and capacitors 14 and 15 connecting the input and output, respectively, of the inverter 11 therethrough to the ground potential.

In this Colpitts oscillator, elements connected exteriorly to the amplifier 11 include, in addition to the vibrating element 12, the resistor 13 and the two capacitors 14 and 15, so many as to result in the increased size of the oscillator.

SUMMARY OF THE INVENTION

The present invention has been developed with a view to substantially eliminating the disadvantages and inconveniences inherent in the prior art oscillators, particularly, Colpitts oscillator, of a type utilizing a piezoelectric vibrating element and has for its essential object to provide a piezoelectric vibrator device effective to minimize the size of an oscillator by the use of the minimized number of component parts to be used in combination with an inverting amplifier.

Another important object of the present invention is to provide a piezoelectric vibrator device of the type referred to above, wherein capacitors necessitated in the oscillator are built in the vibrator device to accomplish the minimized number of the component parts, thereby contributing to the reduction in size of the oscillator.

These objects of the present invention can be accomplished by providing a piezoelectric vibrator device which comprises a vibrating element, a support frame surrounding the vibrating element and supporting the vibrating element by means of at least two support arms protruding spacedly inwards from the support frame and terminating in continuation to the vibrating element, said vibrating element and said frame being of one-piece construction fabricated from a sheet of elastic invariable metal, a layer of ZnO formed on the vibrating element and also on a portion of the support frame integral with a part of the ZnO layer on the vibrating element, a first electrode formed on the vibrating element so as to overlay that part of the ZnO layer on the vibrating element, and a second electrode formed on that portion of the support frame so as to overlay another part of the ZnO layer on the support frame, said second electrode cooperating with the metal of constant elasticity to define a static capacitance with the ZnO layer serving as a dielectric body.

The piezoelectric vibrator device may also comprises a capacitor chip mounted on the part of the ZnO layer on the support frame at a location clear from the second electrode.

BRIEF DESCRIPTION OF THE DRAWINGS

These and other objects and features of the present invention will become clear from the following description taken in conjunction with preferred embodiments thereof with reference to the accompanying drawings, in which.

DETAILED DESCRIPTION OF THE EMBODIMENTS

Figure 1:
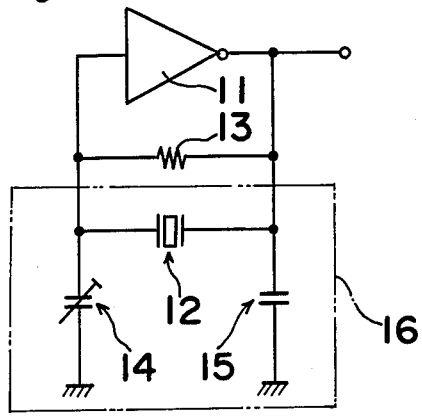
FIG. 1 is a circuit diagram showing Colpitts oscillator.

Before the description of the embodiments of the present invention proceeds, it is to be noted that like parts are designated by like reference numerals throughout FIGS. 2 to 5.

Figure 2:
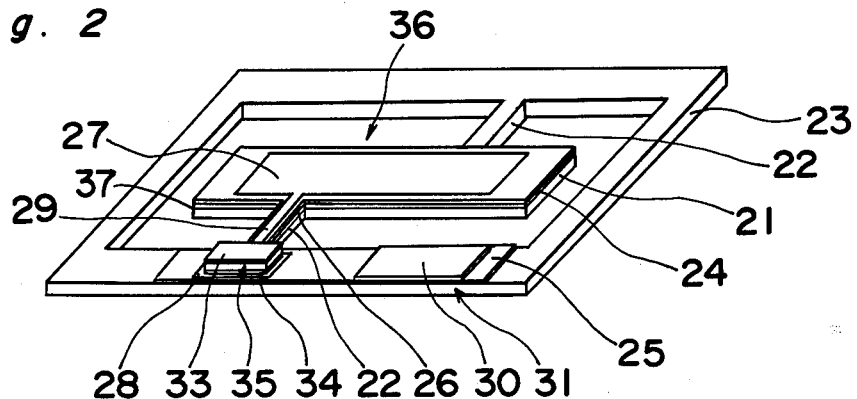
FIG. 2 is a perspective view of a piezoelectric vibrator device according to a preferred embodiment thereof.

Referring first to FIG. 2, a piezoelectric vibrator device comprises a generally rectangular vibrating element 21, a pair of support arms 22, and a generally rectangular support frame 23 supporting the vibrating element 21 interiorly thereof by means of the support arms 22, all of said elements 21 to 23 being of one-piece construction prepared by the use of any known method, for example, by the use of a photolithographic technique from a sheet of elastic invariable metal such as, for example, elinver.

The arms 22 protruding inwardly from the frame 23 in the opposite directions with respect to each other terminate in continuation with the vibrating element 21 in alignment with the respective nodes of vibration of the element 21.

The vibrating element 21 and a portion of the frame 23 have respective layers 24 and 25 of ZnO formed thereon, which layers 24 and 25 are connected together by means of a layer 26 of ZnO formed on one of the arms 22 which extends between the vibrating element 21 and that portion of the frame 23. In practice, the ZnO layer 24, 25 and 26 may be of one-piece construction.

An aluminum layer 37 is located between the vibrating element 21 and the ZnO layer 24 to minimize the change in resonance frequency of the vibrator 36 which would result from change in temperature.

Formed on and overlaying respective portions of the ZnO layers 24, 25 and 26 are electrodes 27, 29 and 28, respectively, which electrodes 27, 29 and 28 are connected together and, therefore, may be of one-piece construction.

Another portion of the ZnO layer 25 opposite to that portion thereof where the electrode 28 is overlaid has an electrode 30 formed thereon, which electrode 30 forms, in cooperation with the frame 23 of elinvar, a capacitor 31 having its dielectric body constituted by the ZnO layer 25.

The static capacitance of the capacitor 31 so formed can be adjusted by mechanically removing, for example, trimming by the use of a laser or by grinding, the electrode 30 subsequent to the formation of the electrode 30. In this respect, according to the conventional method, the adjustment of the oscillating frequency has been adjusted by utilizing a trimmer capacitor for the capacitor 14 (FIG. 1). However, the trimmer capacitor has a drawback in that it is bulky in size. Although not only for minimizing the size of the oscillator, but also for facilitating the adjustment of the oscillating frequency, a fixed capacitor may be employed for the capacitor 14 in place of the trimmer capacitor on the one hand and the length of the element 21 may be modified on the other hand, it is time-consuming and difficult to modify the length of the element 21 by grinding because the element 21 itself is small in size. However, it is very simple and easy to modify the surface area of the electrode 30 by vaporizing a part thereof with the use of a laser energy. While the adjustment of the oscillating frequency is essential during the manufacture of the products, the formation of the capacitor on the frame such as in the present invention has an advantage in that the adjustment of the oscillating frequency can readily and easily be done without increasing the size.

Figure 3:
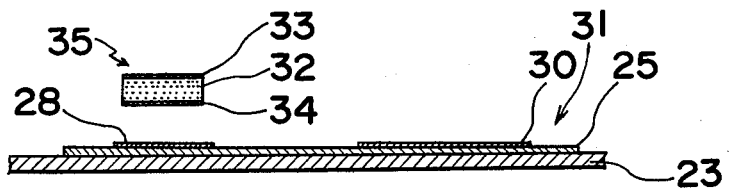
FIG. 3 is a sectional view showing the positioning of a capacitor chip to complete the device of FIG. 2.

The piezoelectric vibrator device also comprises, as best shown in FIGS. 2 and 3, a capacitor chip 35 of a construction having a pair of opposite electrode layers 33 and 34 with a dielectric body 32 sandwiched therebetween. This capacitor chip 35 is mounted on the frame 23 with the electrode layer 34 soldered to the electrode 28 on the ZnO layer 25 which has been drawn from the electrode 27 to the frame 23 through the electrode 29.

In the construction described above, the vibrating element 21, the ZnO layer 24 and the electrode 27 constitute a plate-like vibrator 36, wherein the vibrating element is electrically connected to the frame 23 through the arms 22 and the electrode 27 is electrically connected to the electrode layer 34 of the capacitor chip 35 through the electrodes 29 and 28.

Figure 4:
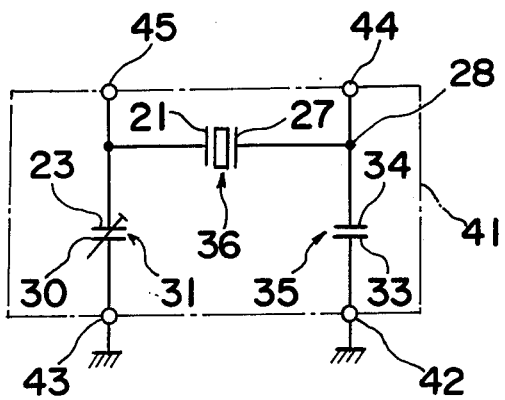
FIG. 4 is an equivalent circuit diagram of the device shown in FIG. 2.

Accordingly, when the electrode 30 on the ZnO layer 25 on the frame 23 and the electrode layer 33 of the capacitor chip 35 are both connected to the ground, a pi circuit 41 shown in FIG. 4 can be obtained wherein the capacitor chip 35 and the capacitor element 31 are respectively connected between the vibrator 36 and the ground.

The circuit 41 shown in FIG. 4 is identical with a feedback loop for the inverting amplifier 11 shown in FIG. 1 and, therefore, when the electrode layer 33 of the capacitor chip 35 and the electrode 30 of the capacitor element 31 are connected through respective terminals 42 and 43 to ground and when the electrode 28 (the electrode layer 34 of the capacitor chip 35) and the frame 23 are respectively connected through terminals 44 and 45 to output and input of the inverting amplifier 11, Colpitts oscillator can be obtained using only three component parts, namely, the inverter 11, the resistor 13 (FIG. 1) and the piezoelectric vibrating device of FIG. 2.

Figure 5:
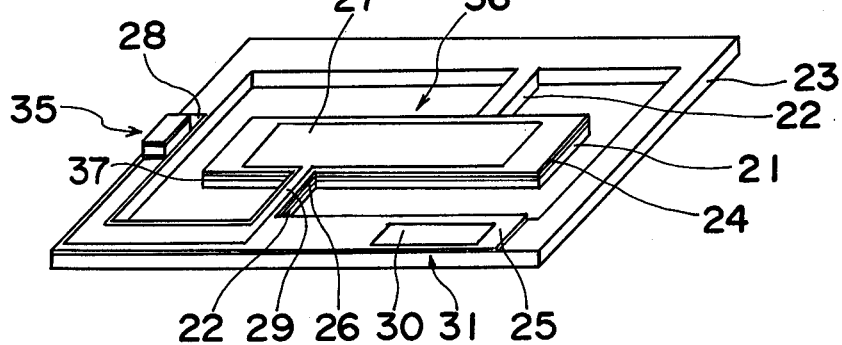
FIG. 5 is a view similar to FIG. 2, showing another preferred embodiment of the present invention.

It is to be noted that the position where the capacitor chip 35 is to be mounted and/or the position where the capacitor element 31 is formed is not necessarily limited to such as described with reference to and shown in FIGS. 2 and 3. By way of example, as shown in FIG. 5, the electrode 28 continued from the electrode 27 through the electrode 29 may be formed on one of the opposite shorter side portions of the frame 23 and the capacitor chip 35 may be mounted thereon by the use of any known bonding agent or a soldering technique.

From the foregoing full description of the present invention, it has now become clear that, since the capacitors used as component parts of the pi feedback loop for Colpitts oscillator are integrated with the frame supporting the vibrating element, the oscillator can be fabricated with the minimized number of the component parts, namely, the inverting amplifier, the resistor and the piezoelectric vibrator device of the present invention. Specifically, the two capacitors necessitated to form the Colpitts oscillator are built into the piezoelectric vibrator device, thereby eliminating the connection of the capacitors exteriorly to the amplifier to form the Colpitts oscillator.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A piezoelectric vibrator device, comprising:
   a vibrating element, a support frame surrounding the vibrating element and supporting the vibrating element by means of at least two support arms protruding inwardly of said support frame and terminating integrally with said vibrating element, said vibrating element, said support frame, and said support arms being of one-piece construction fabricated from a sheet of elastic invariable metal;
   a layer of aluminum formed on a portion of said vibrating element;
   a first layer of ZnO formed on said aluminum layer;
   a second layer of ZnO formed on a first portion of said support frame;
   a first electrode formed on said first ZnO layer such that said first electrode, said first ZnO layer, said aluminum layer and said vibrating element form a piezoelectric vibrator;
   a second electrode formed on said second ZnO layer such that said portion of said support frame, said second ZnO layer and said second electrode define a static capacitance; and
   a capacitor chip mounted to said support frame at a location which is spaced from said first capacitor and electrically connected to said first electrode.

2. The piezoelectric vibrator device of claim 1, wherein said first and second ZnO layers are defined by spaced portions of a single ZnO layer.

3. The piezoelectric vibrator device of claim 2, wherein:
   said single ZnO layer extends over a second portion of said support frame which is spaced from said first portion;
   said first electrode extends over said single ZnO layer to said second portion of said support frame; and
   said capacitor chip is mounted on that portion of said first electrode which is located at said second portion of said frame.

* * * * *